US008064215B2

(12) United States Patent
Chung et al.

(10) Patent No.: US 8,064,215 B2

(45) Date of Patent: Nov. 22, 2011

(54) SEMICONDUCTOR CHIP PACKAGE AND PRINTED CIRCUIT BOARD

(75) Inventors: Yul-Kyo Chung, Yongin-si (KR); Sung Yi, Suwon-si (KR); Soon-Gyu Yim, Seongnam-si (KR); Seog-Moon Choi, Seoul (KR); Jin-Gu Kim, Suwon-si (KR); Young-Do Kweon, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 404 days.

(21) Appl. No.: 12/230,872

(22) Filed: Sep. 5, 2008

(65) Prior Publication Data

US 2009/0073667 A1 Mar. 19, 2009

(30) Foreign Application Priority Data

Sep. 18, 2007 (KR) ........................ 10-2007-0094916

(51) Int. Cl.
*H05K 1/18* (2006.01)

(52) U.S. Cl. ........................................ 361/763; 174/260

(58) Field of Classification Search .................. 361/795, 361/761–764; 174/256, 258–260; 257/700, 257/701, 729
See application file for complete search history.

(56) References Cited

U.S. PATENT DOCUMENTS

| | | | | |
|---|---|---|---|---|
| 6,894,396 | B2 * | 5/2005 | Shioga et al. | 257/777 |
| 6,975,516 | B2 * | 12/2005 | Asahi et al. | 361/761 |
| 7,489,032 | B2 * | 2/2009 | Jobetto | 257/700 |
| 2001/0010627 | A1 * | 8/2001 | Akagawa | 361/761 |
| 2007/0178412 | A1 * | 8/2007 | Jung et al. | 430/314 |

FOREIGN PATENT DOCUMENTS

| | | |
|---|---|---|
| JP | 05267557 | * 10/1993 |
| JP | 2004-79701 | 3/2004 |

OTHER PUBLICATIONS

Korean Patent Office Action, mailed Sep. 30, 2008 and issued in corresponding Korean Patent Application No. 10-2007-0094916.

* cited by examiner

*Primary Examiner* — Yuriy Semenenko

(57) ABSTRACT

A semiconductor chip package and a printed circuit board having an embedded semiconductor chip package are disclosed. The semiconductor chip package may include a semiconductor chip that has at least one chip pad formed on one side, and a capacitor formed on the other side of the semiconductor chip.

4 Claims, 4 Drawing Sheets

351 35 35 35 36 36 37 36 36 35 35 35 352 33 32 31 30 300

SEMICONDUCTOR CHIP PACKAGE AND PRINTED CIRCUIT BOARD

CROSS-REFERENCE TO RELATED APPLICATIONS

This application claims the benefit of Korean Patent Application No. 10-2007-0094916 filed with the Korean Intellectual Property Office on Sep. 18, 2007, the disclosure of which is incorporated herein by reference in its entirety.

BACKGROUND

1. Technical Field

The present invention relates to a semiconductor chip package and a printed circuit board having an embedded semiconductor chip package.

2. Description of the Related Art

In current electronic products, especially portable electronic devices, etc., the variety of consumer demands is continuously increasing. In particular, the demands for multi-functionality, compact sizes, light weight, high speeds, low costs, increased portability, real time access to the wireless Internet, and sophisticated designs are goading developers, designers, and manufacturers alike to provide superior products. Increased competition in providing such products have led to more frequent releases of newer models, exacerbating the burden on those involved. The demands related to mobile products, such as cell phones, PDA's, digital cameras, and laptops, in particular, are greater than ever, one result of which is that the electronic parts for these products are being modularized and integrated, to implement multi-functionality, compact sizes, light weight, and low costs, etc.

In the case of embedding a passive component in a semiconductor chip, there is a limit to the types of material that can be used when considering compatibility with semiconductor processes. Embedding the passive component may also increase chip size or increase cost, and thus impose a limit on applicability. Another method is to embed the passive component in a semiconductor chip package. Methods of forming a capacitor directly inside the package include methods that provide thick film types and methods that provide thin film types.

In the case of a thick film capacitor, a composite material may be used that includes a dielectric filler dispersed in the epoxy resin used for the insulation. Although this may provide superb workability, the dielectric constant may be low, to be about 30, making it difficult to implement a high-capacitance capacitor. On the other hand, a thin film capacitor may provide a high capacitance density, but there is a higher likelihood of electrical leakage caused by defects in the surface of the surface of the copper foil used for the lower electrode.

In order to form a passive component in a semiconductor chip package with greater reliability, a technique has also been conceived of forming a capacitor on the rewiring layer of a semiconductor package. In this case, however, the capacitor may be formed in-between the rewiring lines, so that there is a limit to the size of the capacitor. The material used for the capacitor may also be limited to those that are compatible with the rewiring process, and the degree of freedom may be very low in planning for the processes, with regards, for example, process temperatures and patterning methods, etc.

SUMMARY

An aspect of the invention is to provide semiconductor chip package and a printed circuit board having an embedded semiconductor chip package, in which a capacitor is arranged in an area separated from the rewiring layer of the semiconductor, so that the semiconductor chip may be utilized effectively.

One aspect of the invention provides a semiconductor chip package that includes a semiconductor chip, on one side of which at least one chip pad is formed, and a capacitor formed on the other side of the semiconductor chip.

The capacitor can include an upper electrode formed on the other side of the semiconductor chip, a dielectric layer formed on the upper electrode, and a lower electrode formed on the dielectric layer.

The lower electrode may be electrically connected with a lower pad formed on the other side of the semiconductor chip, while the upper electrode may be electrically connected with an upper pad formed on the other side of the semiconductor chip.

On the one side of the semiconductor chip, a rewiring layer may be stacked that includes a rewiring line electrically connected with the chip pad.

Another aspect of the invention provides a printed circuit board, in which a semiconductor chip is embedded, and in which at least one circuit pattern layer and at least one insulation layer are alternately stacked. In this printed circuit board, a chip pad formed on one side of the semiconductor chip may be electrically connected with a first circuit pattern of the circuit pattern layer, and a capacitor formed on the other side of the semiconductor chip may be electrically connected with a second circuit pattern of the circuit pattern layer.

The capacitor can include an upper electrode formed on the other side of the semiconductor chip, a dielectric layer formed on the upper electrode, and a lower electrode formed on the dielectric layer.

The lower electrode can be electrically connected with a lower pad formed on the other side of the semiconductor chip, and the upper electrode can be electrically connected with an upper pad formed on the other side of the semiconductor chip.

The chip pad and the first circuit pattern may be connected by way of an interposed rewiring layer that includes a rewiring line.

Additional aspects and advantages of the present invention will be set forth in part in the description which follows, and in part will be obvious from the description, or may be learned by practice of the invention.

DETAILED DESCRIPTION

Figure 1A:
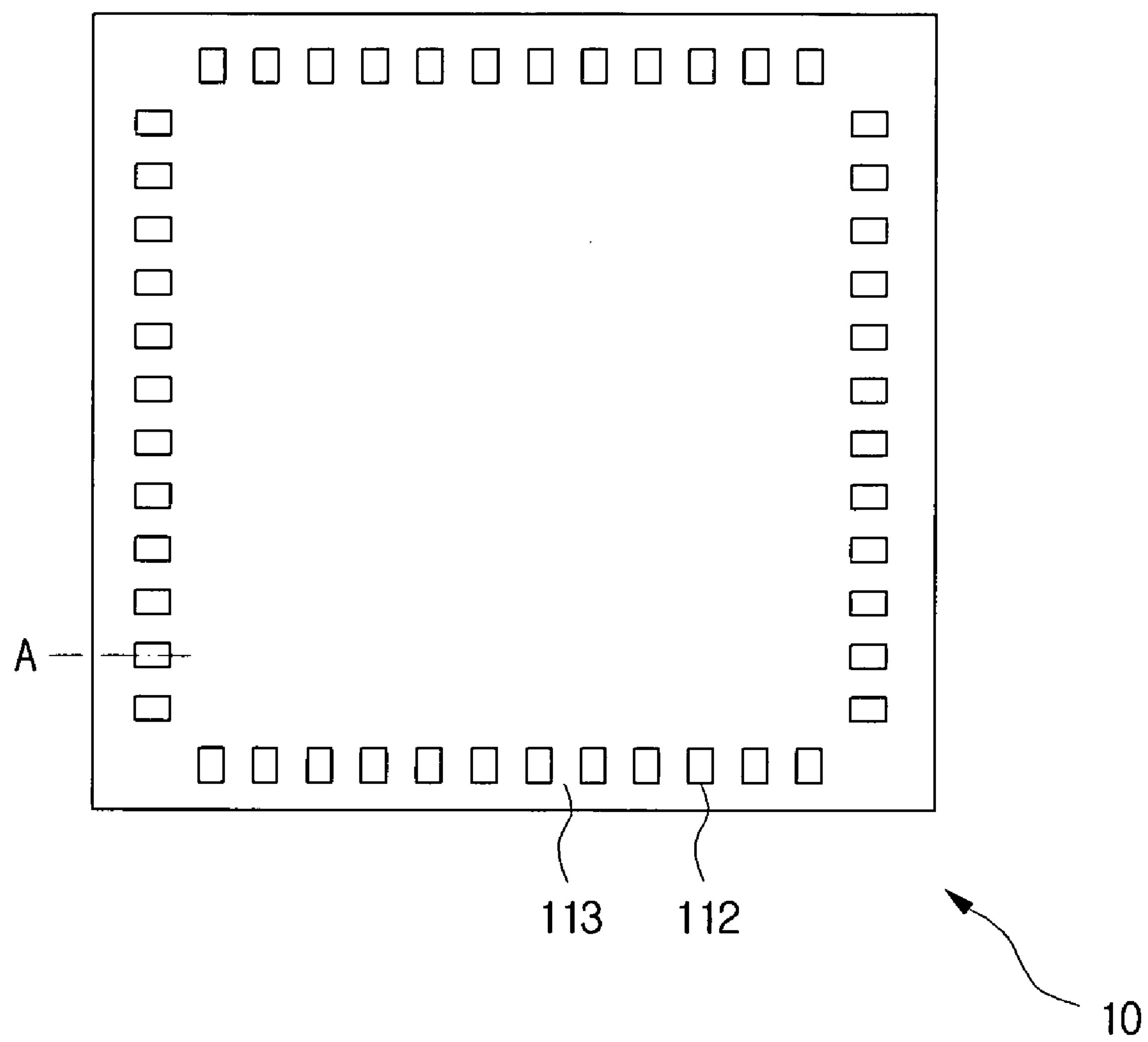
FIG. 1*a* is a bottom view of a semiconductor chip package according to an embodiment of the invention.

The semiconductor chip package and a printed circuit board having an embedded semiconductor chip package according to certain embodiments of the invention will be described below in more detail with reference to the accompanying drawings. Those elements that are the same or are in correspondence are rendered the same reference numeral regardless of the figure number, and redundant explanations are omitted.

Figure 1B:
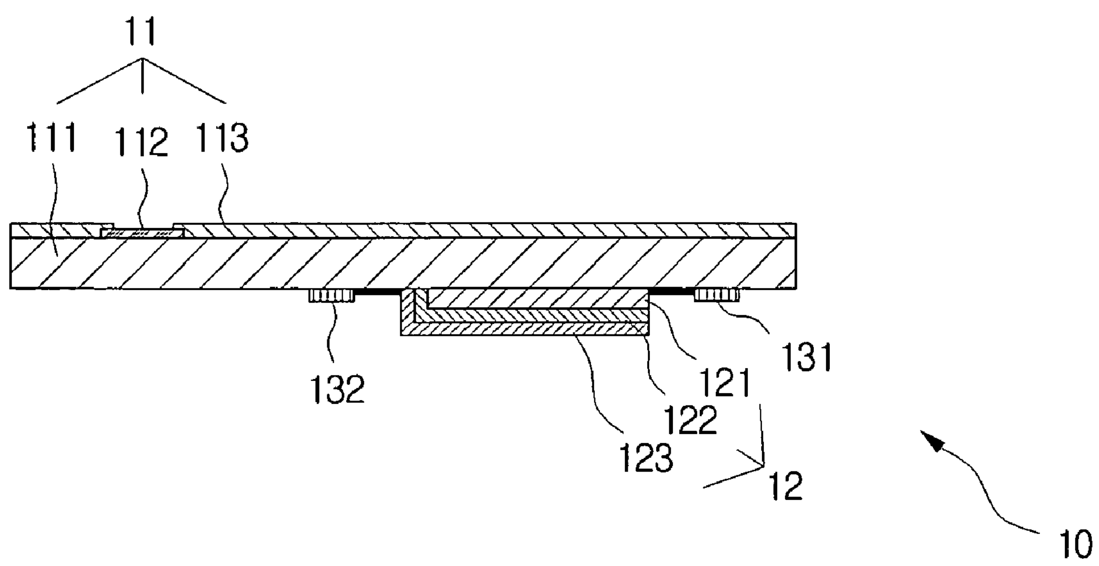
FIG. 1*b* is a cross sectional view of a semiconductor chip package according to an embodiment of the invention.

FIG. 1*a* is a bottom view of a semiconductor chip package according to an embodiment of the invention, and FIG. 1*b* is a cross sectional view of a semiconductor chip package according to an embodiment of the invention. In FIGS. 1*a* and 1*b*, there are illustrated a semiconductor chip package 10, a semiconductor chip 11, a semiconductor substrate 111, chip pads 112, a protective film 113, a capacitor 12, a lower electrode 121, a dielectric layer 122, an upper electrode 123, a lower pad 131, and an upper pad 132.

FIG. 1*b* is a cross sectional view across portion A in FIG. 1*a*, and as illustrated in FIG. 1*b*, a semiconductor chip package 10 can include a semiconductor chip 11 and a capacitor 12 formed on the semiconductor chip 11.

The semiconductor chip 11 can be composed mainly of a semiconductor substrate 111, in which an integrated circuit may be embedded; chip pads 112, which may be positioned on one side of the semiconductor substrate 111 and electrically connected with the integrated circuit; and a protective film 113, which may be stacked on the semiconductor substrate 111 such that the chip pads 112 are exposed.

The capacitor 12 can be formed on the other side of the semiconductor chip 11. The capacitor 12 can be formed by deposition as a thin film. A lower electrode 121 of the capacitor 12 can be formed on the other side of the semiconductor chip 11, while a dielectric layer 122 can be formed on the lower electrode 121. Also, an upper electrode 123 can be formed on the dielectric layer 122. The lower electrode 121 and the upper electrode 123 can be electrically connected respectively to the lower pad 131 and the upper pad 132 formed on the other side of the semiconductor chip 11.

The materials that can be used for the lower electrode 121, upper electrode 123, and dielectric layer 122 of the capacitor 12 are commonly known to those skilled in the art, and thus will not be described here in detail.

In this embodiment, the capacitor 12 can be formed on the other side of the semiconductor chip 11, where the chip pads 112 are not formed, so that the space on the semiconductor chip 11 may be utilized efficiently and the capacitor 12 may be formed in various sizes.

Figure 2:
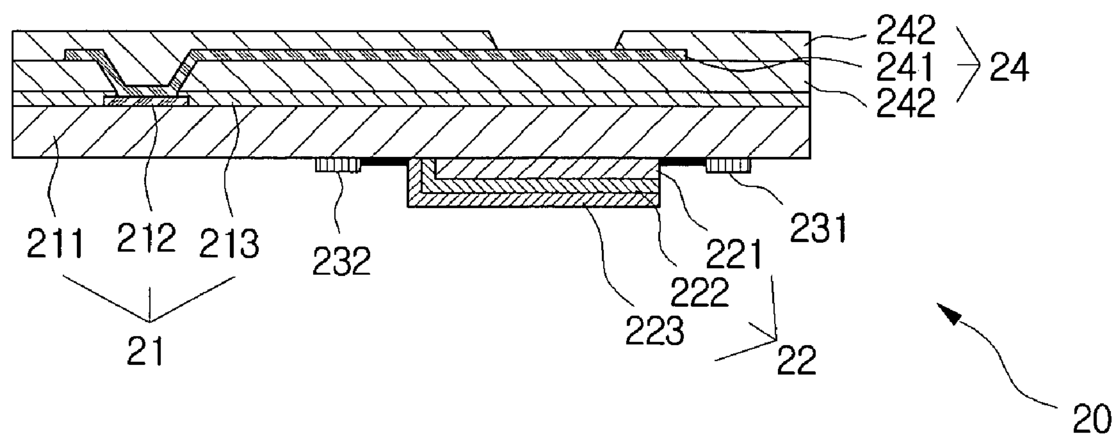
FIG. 2 is a cross sectional view of a semiconductor chip package according to another embodiment of the invention.

FIG. 2 is a cross sectional view of a semiconductor chip package according to another embodiment of the invention. In FIG. 2, there are illustrated a semiconductor chip package 20, a semiconductor chip 21, a semiconductor substrate 211, a chip pad 212, a protective film 213, a capacitor 22, a lower electrode 221, a dielectric layer 222, an upper electrode 223, a lower pad 231, an upper pad 232, a rewiring layer 24, a rewiring line 241, and insulation layers 242.

The example shown in FIG. 2 differs from that of FIG. 1*b* in that a rewiring layer 24 may be formed over one side of the semiconductor chip 21. The following descriptions will focus mainly on such differences, and the descriptions for other elements will not be repeated.

A chip pad 212 formed on one side of the semiconductor chip 21 can have an extremely small diameter, of about 10 to 20 μm. Since a chip pad 212 of this size may cause difficulties in control during the process for manufacturing the printed circuit board, there may be problems in directly connecting the chip pad 212 to the printed circuit board. Thus, the rewiring layer 24 can be formed, using a rewiring process to increase the size of the pad for connecting to the exterior.

The rewiring layer 24 can be composed mainly of insulation layers 242 and a rewiring line 241 placed between the insulation layers 242. The rewiring line 241 can be electrically connected to the chip pad 212 of the semiconductor chip 21, with a portion of the rewiring line 241 exposed to the exterior. The portion of the rewiring line 241 exposed to the exterior may have a larger surface area than that of the chip pad 212, making it easier to connect to an external component.

Figure 3:
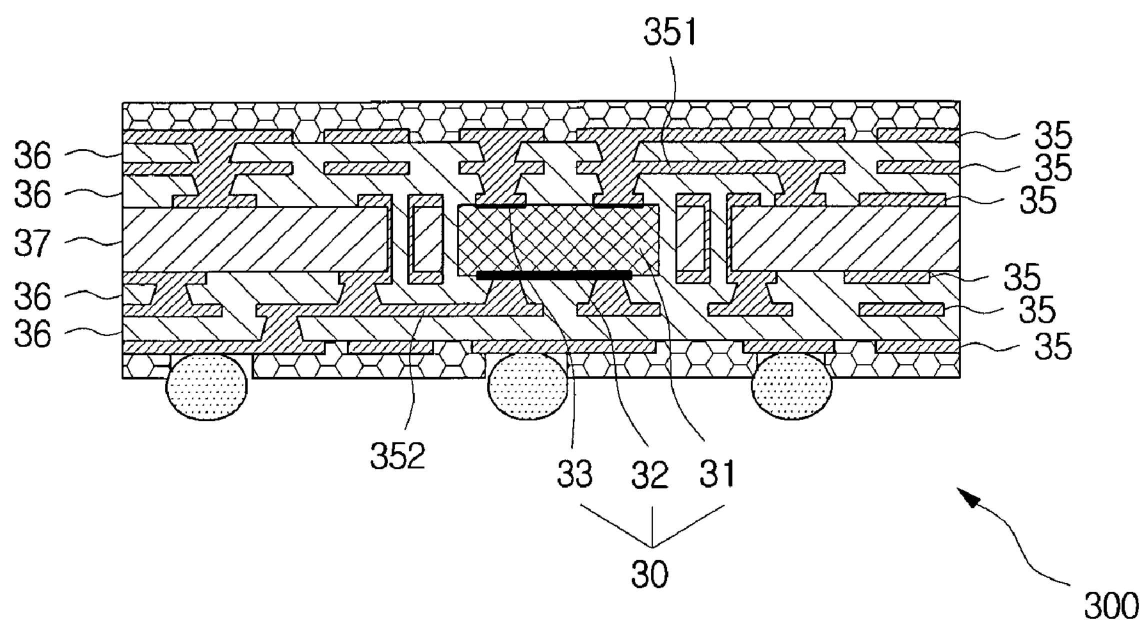
FIG. 3 is a cross sectional view of a semiconductor chip package according to yet another embodiment of the invention.

FIG. 3 is a cross sectional view of a semiconductor chip package according to yet another embodiment of the invention. In FIG. 3, there are illustrated a semiconductor chip package 30, a semiconductor chip 31, a capacitor 32, chip pads 33, circuit pattern layers 35, insulation layers 36, a first circuit pattern 351, a second circuit pattern 352, and a printed circuit board 300.

The structure of a printed circuit board 300 according to this embodiment can include insulation layers 36 and circuit pattern layers 35 stacked in alternation and can include an embedded semiconductor chip package 30. A core layer 37 may also be included in the middle of the printed circuit board 300.

The chip pads 33 can be formed on one side of the semiconductor chip package 30, where the chip pads 33 can be electrically connected with a first circuit pattern 351. The chip pads 33 may also be connected to the first circuit pattern 351 by vias.

Also, the capacitor 32 can be formed on the other side of the semiconductor chip 31. The capacitor 32 can be electrically connected with a second circuit pattern 352.

The connections between the chip pads 33 and the first circuit pattern 351 and between the capacitor 32 and the second circuit pattern 352 in this embodiment can be implemented, after embedding the semiconductor chip package 30 in the printed circuit board 300, by forming vias.

When embedding a semiconductor chip package 30 in the printed circuit board 300 that includes a capacitor 32 formed beforehand on the other side of the semiconductor chip 31 as in the present embodiment, the capacitance of the capacitor 32 can be precisely controlled, because the capacitor 32 can be formed beforehand. Thus, with the capacitor-embedded printed circuit board 300 structured as above, the capacitor can be manufactured, during the manufacturing process for the printed circuit board, with a higher level of reliability in terms of capacitance compared to the conventional printed circuit board formed with a thin film capacitor.

In particular, since there may be no chip pads 33 formed on the other side of the semiconductor chip 31, a larger area may be obtained, and since the other side of the semiconductor chip 31 may be very flat, the capacitor 32 may readily be formed by thin film deposition.

As set forth above, by forming a capacitor as a thin film in a semiconductor chip on a surface other than the surface on which the chip pads are formed, the semiconductor chip may be utilized more efficiently. Also, by using a separate process to form the capacitor as a thin film in the semiconductor chip, a more reliable capacitor may be formed compared to having the capacitor formed during the manufacturing process of the printed circuit board.

Furthermore, when this semiconductor chip package, which includes a capacitor formed on the semiconductor chip, is embedded in the printed circuit board, substantially the same effects can be obtained as the case in which the capacitor is embedded in the printed circuit board.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A semiconductor chip package comprising:

a semiconductor chip having at least one chip pad formed on one surface thereof;

a capacitor formed directly on an other surface of the semiconductor chip;

an upper pad formed directly on the other surface of the semiconductor chip; and a lower pad formed directly on the other surface of the semiconductor chip, wherein the capacitor comprises an upper electrode formed on the other surface of the semiconductor chip and electrically connected with the upper pad, a dielectric layer formed on the upper electrode, and a lower electrode formed on the dielectric layer and electrically connected with the lower pad.

2. The semiconductor chip package of claim 1, further comprising a rewiring layer stacked over the one surface of the semiconductor chip, the rewiring layer comprising a rewiring line electrically connected with the chip pad.

3. A printed circuit board having a semiconductor chip embedded therein and comprising:

a circuit pattern layer comprising first and second circuit patterns;

an insulation layer stacked with the circuit pattern layer; and a semiconductor chip package comprising:

the semiconductor chip having a chip pad formed on one surface thereof and electrically connected with a first circuit pattern of the circuit pattern layer;

a capacitor formed on an other surface of the semiconductor chip and electrically connected with a second circuit pattern of the circuit pattern layer;

an upper pad formed directly on the other surface of the semiconductor chip; and a lower pad formed directly on the other surface of the semiconductor chip, wherein the capacitor comprises an upper electrode formed on the other surface of the semiconductor chip and electrically connected with the upper pad, a dielectric layer formed on the upper electrode, and a lower electrode formed on the dielectric layer and electrically connected with the lower pad.

4. The printed circuit board of claim 3, further comprising a rewiring layer, wherein the chip pad and the first circuit pattern are connected by way of the rewiring layer interposed therebetween, the rewiring layer comprising a rewiring line.

* * * * *